(12) United States Patent
Opitz et al.

(10) Patent No.: US 7,992,443 B2
(45) Date of Patent: Aug. 9, 2011

(54) SENSOR ELEMENT FOR CAPACITIVE DIFFERENTIAL-PRESSURE SENSING

(75) Inventors: Bernhard Opitz, Leonberg (DE);
Christian Doering, Stuttgart (DE);
Hans Artmann, Boeblingen-Dagersheim (DE); Janpeter Wolff, Gerlingen (DE);
Remigius Niekrawietz, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 43 days.

(21) Appl. No.: 12/644,331

(22) Filed: Dec. 22, 2009

(65) Prior Publication Data
US 2010/0170346 A1      Jul. 8, 2010

(30) Foreign Application Priority Data

Jan. 7, 2009    (DE) .................. 10 2009 000 056

(51) Int. Cl.
*G01L 9/12*    (2006.01)
(52) U.S. Cl. ................. 73/718; 73/724; 73/716; 73/736
(58) Field of Classification Search ........................ None
See application file for complete search history.

(56) References Cited

U.S. PATENT DOCUMENTS

| | | | | |
|---|---|---|---|---|
| 4,879,627 A | * | 11/1989 | Grantham | 361/283.3 |
| 5,186,054 A | * | 2/1993 | Sekimura | 73/724 |
| 6,151,967 A | * | 11/2000 | McIntosh et al. | 73/514.32 |
| 6,470,754 B1 | * | 10/2002 | Gianchandani | 73/718 |
| 6,496,348 B2 | * | 12/2002 | McIntosh | 361/115 |
| 2001/0047689 A1 | * | 12/2001 | McIntosh | 73/514.32 |
| 2002/0124656 A1 | * | 9/2002 | McIntosh | 73/753 |
| 2005/0229710 A1 | * | 10/2005 | O'Dowd et al. | 73/718 |
| 2006/0117857 A1 | * | 6/2006 | Zias et al. | 73/724 |

* cited by examiner

*Primary Examiner* — Andre J Allen
(74) *Attorney, Agent, or Firm* — Kenyon & Kenyon LLP

(57) ABSTRACT

A sensor design, respectively a micromechanical sensor structure for capacitive relative-pressure measurement, that will allow very small pressure differentials to be reliably recorded at high absolute pressures even in harsh, particle-laden measuring environments. For that purpose, the micromechanical sensor element includes a deflectable diaphragm structure which is provided with at least one deflectable electrode, and a fixed support structure for at least one fixed counter-electrode which is located opposite the deflectable electrode. The diaphragm structure includes two mutually parallel configured diaphragms that are joined rigidly to one another via at least one connecting crosspiece, so that each application of force to one of the two diaphragms is directly transmitted to the respective other diaphragm. The first diaphragm is able to be pressurized by a first measuring pressure emanating from the front side of the sensor element, and the second diaphragm is able to be pressurized by a second measuring pressure emanating from the rear side of the sensor element. The fixed counter-electrode is located in the sealed volume between the two diaphragms of the diaphragm structure.

10 Claims, 3 Drawing Sheets

SENSOR ELEMENT FOR CAPACITIVE DIFFERENTIAL-PRESSURE SENSING

FIELD OF THE INVENTION

The present invention relates to a micromechanical sensor element for capacitive differential pressure sensing, having a deflectable diaphragm structure which is provided with at least one deflectable electrode, and having a fixed support structure for at least one fixed counter-electrode which is located opposite the deflectable electrode.

BACKGROUND INFORMATION

Pressure sensors equipped with micromechanical sensor elements are used today in machine manufacturing, process technology, automotive engineering, and in medical technology for many diverse measuring tasks. Differential-pressure sensors are used for comparing pressures that prevail in spaces or media that are separated from one another. The media to be measured can be liquids, gases or also vapors.

In automotive engineering, a typical application of micromechanical differential-pressure sensors is to compare the exhaust back pressure upstream and downstream of the particulate filter. Since, in this connection, very high absolute pressures occur, and the exhaust gases create a harsh particle-laden measuring environment, ever greater demands are placed on the dynamics and ruggedness of the sensor element in terms of its micromechanical structure, but also its signal acquisition.

One approach for determining differential pressure provides for recording the two measurement pressures to be mutually compared using two independent absolute pressure sensors and then for calculating the difference between the thus obtained measured values. For the most part, however, this method does not yield accurate enough results in practice. The reason for this is that the measuring accuracy of the generally available absolute-pressure measuring devices is not high enough, particularly in high pressure ranges and/or at high absolute pressures, but at small differential pressures, so that it does not suffice to determine the pressure differential precisely enough.

SUMMARY OF THE INVENTION

The present invention provides a sensor design, respectively a micromechanical sensor structure for capacitive relative-pressure measurement that will allow very small pressure differentials to be reliably recorded at high absolute pressures even in harsh, particle-laden measuring environments.

To this end, the diaphragm structure of the sensor element according to the present invention includes two mutually parallel configured diaphragms that are joined rigidly to one another via at least one connecting crosspiece. This connection allows each application of force to one of the two diaphragms to be directly transmitted to the respective other diaphragm. The first diaphragm of the diaphragm structure is able to be pressurized by a first measuring pressure emanating from the front side of the sensor element, while the second diaphragm is able to be pressurized by a second measuring pressure emanating from the rear side of the sensor element. The fixed counter-electrode of the sensor element according to the present invention is located in the sealed volume between the two diaphragms of the diaphragm structure.

In response to the two-sided pressurization of the dual-diaphragm structure of the sensor element according to the present invention, the diaphragm structure is deflected proportionately to the differential pressure to be determined. In this case, there is no need for the sensor structure to be designed for the absolute pressures to be expected, but rather for the pressure range within which the difference between the measuring pressures to be compared fluctuates. For this reason, the diaphragm structure of the sensor element according to the present invention may be designed to be comparatively sensitive for applications where this range is significantly smaller than the fluctuation range of the individual measuring pressures. This considerably enhances the accuracy of the measurement results.

As already mentioned, the sensor design according to the present invention provides for a capacitive signal acquisition. In this context, the dual-diaphragm structure is not merely used for supporting at least one movable electrode. It also provides a mechanical protection for the measuring capacitor since the at least one fixed counter-electrode is located in the sealed volume between the two diaphragms of the dual-diaphragm structure. The media to be measured, in particular, are not able to corrode or contaminate the electrodes located inside of the sealed volume. Therefore, the sensor element according to the present invention is especially well suited for what are commonly known as "harsh environment" applications. However, the reliability of the measuring results and the service life of the sensor element are also significantly enhanced in non-harsh measuring environments by configuring the measuring electrodes inside of the hollow space of the dual-diaphragm structure.

In principle, there are different options for implementing the fixed support structure, including the at least one fixed electrode, as well as for implementing the dual-diaphragm structure according to the present invention, and for configuring the at least one movable electrode on this diaphragm structure.

On the whole, it proves to be advantageous, in terms of providing the smallest possible lateral dimensions of the sensor structure, when the fixed support structure is configured between the two diaphragms of the diaphragm structure.

In a first variant of the sensor element according to the present invention, the at least one deflectable electrode may then be configured in the middle region of a diaphragm of the dual-diaphragm structure. This middle region of the diaphragm is advantageously stiffened, so that diaphragm deformations preferably occur in the flexurally soft peripheral region of the diaphragm, and the electrode itself is not deformed upon deflection of the diaphragm structure. This measure is directed to minimizing offset errors and to simplifying the signal analysis.

In contrast, in a second variant of the sensor element according to the present invention, the dual-diaphragm structure includes a support plate specifically for the at least one deflectable electrode. This support plate is located between the two diaphragms and is rigidly joined thereto via the at least one connecting crosspiece between the two diaphragms. The support plate, together with the diaphragm structure, is thereby deflected relative to the fixed support structure provided for the at least one fixed electrode. In this variant, the two diaphragms of the diaphragm structure may be designed to be thin and flexurally soft over the entire surface thereof, thereby enhancing the measuring sensitivity without impeding the signal analysis. In this case, the diaphragm deformations have the sole effect of deflecting the support plate together with the deflectable electrode, not, however, of deforming this electrode.

In this second variant of the dual-diaphragm structure according to the present invention, the fixed support structure, together with the at least one counter-electrode, as described above, may be configured between the two diaphragms of the dual-diaphragm structure. However, the fixed support structure, together with the counter-electrode, may also be laterally joined to a diaphragm of the diaphragm structure. In such a case, the hollow space extends between the two diaphragms of the diaphragm structure to underneath the fixed support structure. The support plate, together with the deflectable electrode, then extends within this hollow space parallel to the fixed support structure. This variant features an especially simple vertical structural design.

In one advantageous further refinement of the present invention, at least one deflectable electrode is assigned to each of the two diaphragms of the deflectable dual-diaphragm structure, and a fixed counter-electrode is assigned to each of these deflectable electrodes, allowing differential capacitances to be created for purposes of signal acquisition. This enhances both the sensitivity, as well as the reliability of the measured-value acquisition. In this connection, a symmetrical design of the deflectable diaphragm structure, together with the deflectable electrodes, relative to the fixed support structure, together with the fixed electrodes proves to be especially advantageous, respectively as does a symmetrical realization of the deflectable diaphragm structure and of the fixed support structure connected thereto, relative to the support plate for the deflectable electrodes.

DETAILED DESCRIPTION

Figure 1:
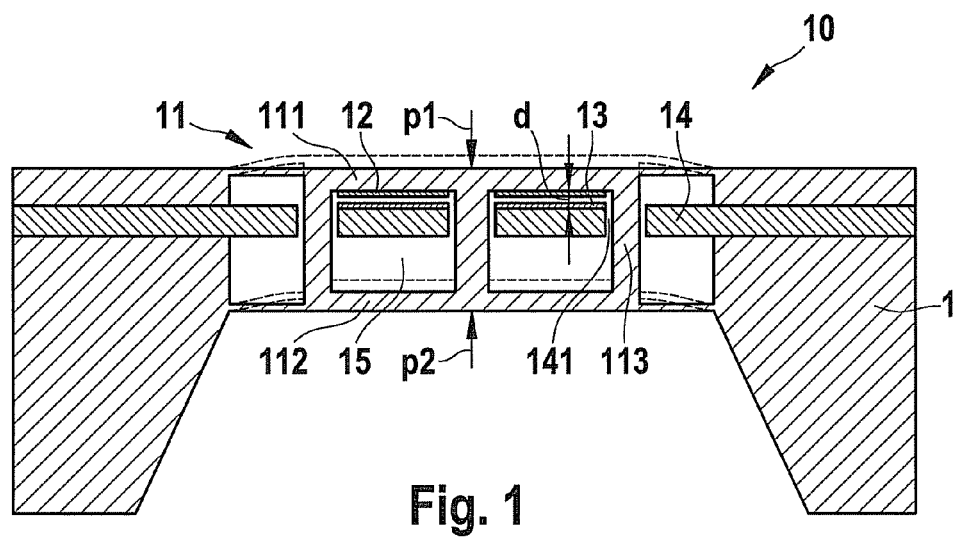
FIG. 1 shows a schematized sectional view of a first variant of a sensor element according to the present invention, having an electrode pair.

Micromechanical sensor element 10, illustrated in FIG. 1, for capacitive differential pressure sensing includes a diaphragm structure 11, which is implemented in accordance with the present invention in the form of a dual diaphragm having two mutually parallel disposed diaphragms 111 and 112. In the exemplary embodiment shown here, these two diaphragms 111 and 112 are rigidly interconnected via three connecting crosspieces 113, so that each application of force to one of the two diaphragms 111 or 112 is directly transmitted to the respective other diaphragm 112 or 111. The one diaphragm 111 of diaphragm structure 11 is pressurized by a first medium to be measured, i.e., by a first measuring pressure p1 emanating from the front side of sensor element 10, while the other diaphragm 112 is pressurized by a second medium to be measured, i.e., by a second measuring pressure p2 emanating from the rear side of sensor element 10. Altogether, therefore, pressure differential $\Delta p = p1-p2$ acts on diaphragm structure 11. Diaphragm structure 11, which is deflected proportionately, is shown here by a dashed line.

In the case of sensor element 10, the middle regions of the two diaphragms 111 and 112 are strengthened in comparison to the peripheral region and are thus stiffened. In this case, the diaphragm deformations preferably occur in the flexurally soft peripheral region. Configured on the surface of the one diaphragm 111 facing away from the medium to be measured is an electrode 12 which is deflected together with diaphragm 111, respectively diaphragm structure 11. Since this electrode 12 is located in the stiffened middle region of diaphragm 11, it is not deformed in the process. Together with a fixed counter-electrode 13, deflectable electrode 12 forms a measuring capacitor for purposes of signal acquisition.

Counter-electrode 13 is configured on a fixed support structure 14 which is permanently joined to substrate 1 of sensor element 10 and extends through sealed volume 15 between the two diaphragms 111 and 112 of diaphragm structure 11. Formed in support structure 14 for connecting crosspieces 113 are through-going openings 141 which permit a deflection of diaphragm structure 11.

In response to deflections of diaphragm structure 11, the distance between electrode 12 and fixed counter-electrode 13 changes, as does, consequently, the capacitance of the measuring capacitor. This change in capacitance is analyzed as a differential pressure-dependent sensor signal. If the two pressures p1 and p2 to be compared are equal to zero or are identical, then the resultant force also acting on diaphragm structure 11 is also equal to zero. In this case, the distance between electrodes 12 and 13 remains unchanged. The stiffening of the middle region of diaphragm 111 acts to minimize the offset error which is caused by an oppositely directed deformation of diaphragm 111—and thus of electrode 12—when the absolute pressure level changes, but $\Delta p$ remains constant.

Figure 2:
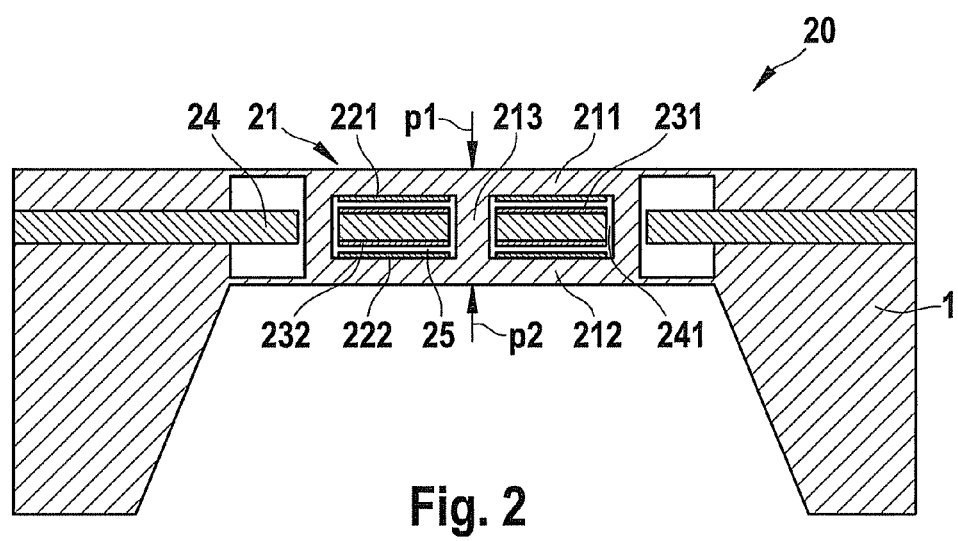
FIG. 2 shows a schematized sectional view of such a sensor element having two electrode pairs.

FIG. 2 shows a symmetrical variant of the sensor structure shown in FIG. 1 where differential capacitances are created for the purpose of signal acquisition. Diaphragm structure 21 of micromechanical sensor element 20 shown here is likewise a dual diaphragm having two mutually parallel disposed diaphragms 211 and 212, which are rigidly interconnected via three connecting crosspieces 213. The middle regions of the two diaphragms 211 and 212 are also reinforced in comparison to the flexurally soft peripheral regions. Here, however, fixed support structure 24 is configured in the middle between the two diaphragms 211 and 212 in hollow space 25 and is joined to substrate 1 of sensor element 20. Comparably to sensor element 10, through-going openings 241 for connecting crosspieces 213 are formed in support structure 24 to permit a deflection of diaphragm structure 21.

In the case of sensor element 20, both diaphragms 211 and 212 are provided with an electrode 221 or 222. These electrodes 221 and 222 are each configured in the stiffened middle region in the surface bounding hollow space 25, so that they are deflected together with diaphragm structure 21, but are not deformed. Assigned to each of the two electrodes 221 and 222 is a fixed counter-electrode 231 or 232 on the respective opposite surface of support structure 24. To prevent a short circuit between the two electrodes of a measuring capacitor, for example, in the case of an overload situation, the surface of one, or also of both electrodes may be provided with an electrical insulation layer.

Comparably to sensor element 10, the one diaphragm 211 of diaphragm structure 21 is pressurized by a first measuring pressure p1 emanating from the front side of sensor element 20, while the other diaphragm 212 is pressurized by a second measuring pressure p2 emanating from the rear side of sensor element 20, so that, altogether, pressure differential $\Delta p = p1-p2$ acts on diaphragm structure 21.

In response to deflections of diaphragm structure 21, the distances and, thus, also the capacitances between electrodes 221 and 231 and between electrodes 222 and 232 change in an opposite sense. In this case, the difference between the two capacitances is analyzed as a differential pressure-dependent sensor signal. The direction of the pressure differential is determined on the basis of the preceding sign of the differential capacitance.

Figure 3:
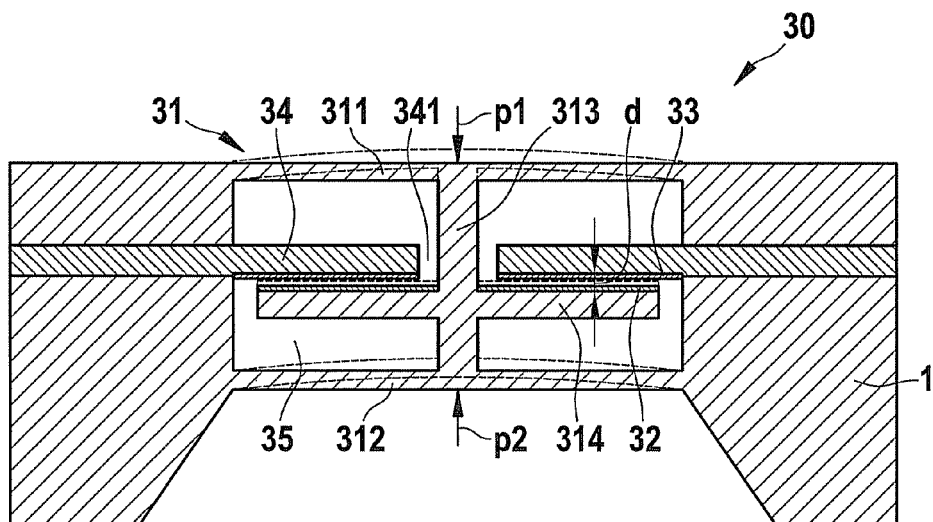
FIG. 3 shows a schematized sectional view of a second variant of a sensor element according to the present invention, having an electrode pair.

In contrast to the above discussed variants of a sensor element according to the present invention for capacitive differential pressure sensing, movable electrode 32 in the case of sensor element 30 illustrated in FIG. 3 is not configured on one of the two diaphragms 311 or 312 of dual-diaphragm structure 31, but rather on a rigid support plate 314 which is deflected as part of diaphragm structure 31 together with the same. In this case, the two diaphragms 311 and 312 of diaphragm structure 31 are designed to be thin and deformable over the entire surface thereof and rigidly interconnected via merely one connecting crosspiece 313 that is configured in the middle. Support plate 314 is configured at this connecting crosspiece 313 and extends parallel to the two diaphragms 311 and 312 and parallel to a fixed support structure 34, which is permanently joined to substrate 1 of sensor element 30 and has through-going openings 341 for connecting crosspiece 313. Both support plate 314, as well as fixed support structure 34 are located within sealed volume 35 between the two diaphragms 311 and 312 of diaphragm structure 31. Movable electrode 32 is configured on the surface of support plate 314 facing support structure 34 and, together with a counter-electrode 33, which is located on the opposite surface of fixed support structure 34, forms a measuring capacitor.

Comparably to sensor elements 10 and 20 discussed above, in the case of sensor element 30 as well, the one diaphragm 311 of diaphragm structure 31 is pressurized by a first measuring pressure p1 emanating from the front side of sensor element 30, while the other diaphragm 312 is pressurized by a second measuring pressure p2 emanating from the rear side of sensor element 30. Diaphragm structure 31, which is deflected proportionately to pressure difference $\Delta p=p1-p2$, is shown here by a dashed line. In response to deflections of diaphragm structure 31, the distance between support plate 314 and fixed support structure 34, respectively, the distance between electrode 32 and fixed counter-electrode 33 changes, as does, consequently, the capacitance of the measuring capacitor. This change in capacitance is analyzed as a differential pressure-dependent sensor signal.

Figure 4:
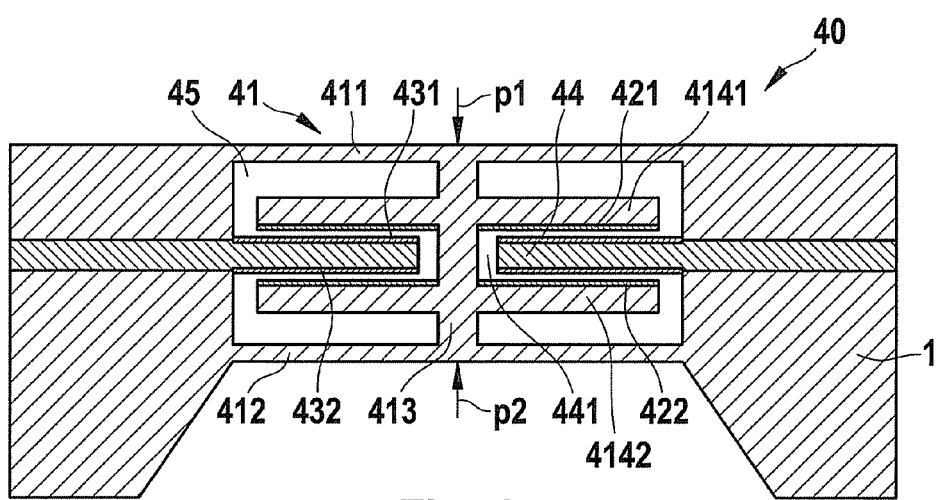
FIG. 4 shows a schematized sectional view of such a sensor element having two electrode pairs.

FIG. 4 shows a symmetrical variant of the sensor structure shown in FIG. 3, i.e., a sensor element 40 having a dual-diaphragm structure 41 configured symmetrically to fixed support structure 44. Comparably to sensor element 30, the two diaphragms 411 and 412 of diaphragm structure 41 are designed to be thin and deformable over the entire surface thereof and rigidly interconnected via merely one connecting crosspiece 413 that is configured in the middle. However, diaphragm structure 41 of sensor element 40 includes two rigid support plates 4141 and 4142, which are configured between the two diaphragms 411 and 412 on the one connecting crosspiece 413. Accordingly, both support plates 4141 and 4142 are deflected as part of diaphragm structure 41, together with the same. Support plates 4141 and 4142 are located within volume 45 between the two diaphragms 411 and 412 and extend parallel thereto. Configured in the middle between the two support plates 4141 and 4142 and parallel thereto is fixed support structure 44, which is permanently joined to substrate 1 of sensor element 40 and has through-going openings 441 for connecting crosspiece 413. Sensor element 40 encompasses two movable electrodes 421 and 422, which are each configured on the surface of support plate 4141 and 4142, respectively, facing support structure 44. Assigned to each of the two movable electrodes 421 and 422 is a counter-electrode 431 or 432 on the opposite surface of support structure 44. Comparably to sensor element 20, the signal acquisition is carried out in this case by the creation of differential capacitances.

Figure 5:
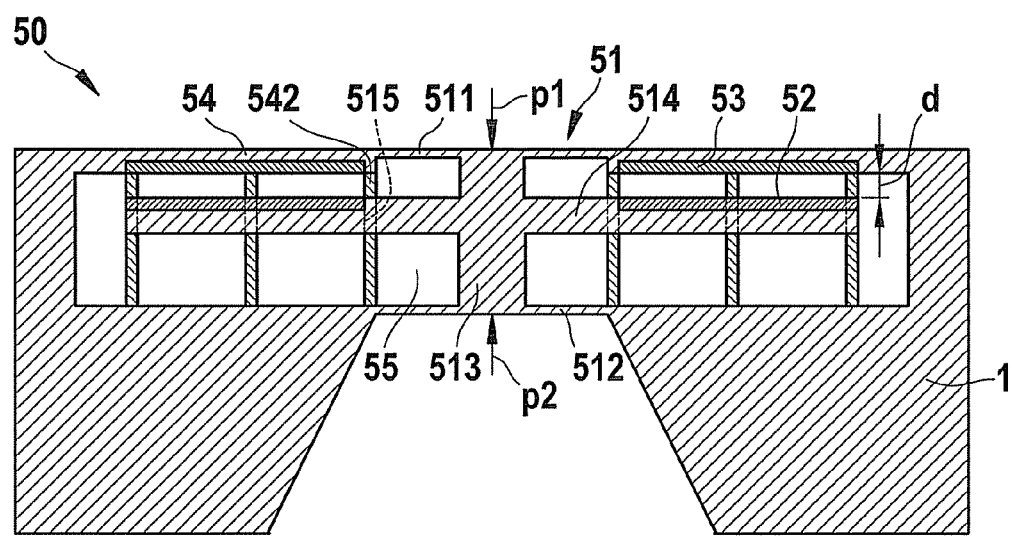
FIG. 5 shows a schematized sectional view of a third variant of a sensor element according to the present invention, having an electrode pair.

Comparably to sensor element 30, movable electrode 52 of sensor element 50 according to the present invention illustrated in FIG. 5 is configured on a rigid support plate 514 between the two diaphragms 511 and 512 of dual-diaphragm structure 51. This support plate 514 is permanently connected to the two diaphragms 511 and 512 via rigid connecting crosspiece 513 configured in the middle, so that it is deflected as part of diaphragm structure 51, together with the same.

In contrast to the above described exemplary embodiments, hollow space 55 of sensor element 50 extends laterally over the diaphragm region to underneath a fixed support structure 54 for a fixed counter-electrode 53. Thus, fixed support structure 54 is laterally joined to diaphragm 511, so that diaphragm 511 is surrounded by support structure 54. To strengthen support structure 54, it is joined by supporting columns 542 to substrate 1 of component 50.

Counter-electrode 53 is configured in the surface of support structure 54 facing hollow space 55 and is thus protected from environmental influences. Through-going openings 515 for supporting columns 542 are configured in support plate 514 provided for deflectable electrode 52. They extend parallel to diaphragms 511 and 512 and to fixed support structure 54, through hollow space 55, so that deflectable electrode 52 and fixed counter-electrode 53 are disposed in mutual opposition and form a measuring capacitor. The pressurization and signal acquisition processes are carried out comparably to the exemplary embodiments described above.

It is noted here that the variant illustrated in FIG. 5 of a sensor element according to the present invention may also have a symmetrical design and include two electrode pairs. In this case, the deflectable diaphragm structure, the fixed support structure, and the configuration of the deflectable and fixed electrodes would be symmetrical with respect to the support plate provided for the deflectable electrodes.

What is claimed is:

1. A micromechanical sensor element for capacitive differential pressure sensing, comprising:
    at least one deflectable diaphragm structure, which is provided with at least one deflectable electrode, the diaphragm structure including two mutually parallel configured diaphragms that are joined rigidly to one another via at least one connecting crosspiece, so that each application of force to one of the two diaphragms is directly transmitted to the respective other diaphragm, a first of the two diaphragms being able to be pressurized by a first measuring pressure emanating from a front side of the sensor element, a second of the two diaphragms being able to be pressurized by a second measuring pressure emanating from a rear side of the sensor element; and
    at least one fixed support structure for at least one fixed counter-electrode, which is situated opposite the deflectable electrode, the fixed counter-electrode being situated in a sealed hollow space between the two diaphragms of the diaphragm structure.

2. The sensor element according to claim 1, wherein the fixed support structure is situated in the sealed hollow space between the two diaphragms of the diaphragm structure.

3. The sensor element according to claim 2, wherein the at least one deflectable electrode is configured in a middle region of a diaphragm of the diaphragm structure.

4. The sensor element according to claim 3, wherein at least the middle region of a diaphragm provided with an electrode is stiffened, so that diaphragm deformations occur in a flexurally soft peripheral region of the diaphragm.

5. The sensor element according to claim 1, wherein the diaphragm structure includes at least one support plate for the at least one deflectable electrode, and the support plate is situated in the sealed hollow space between the two diaphragms and is rigidly connected thereto via the at least one connecting crosspiece.

6. The sensor element according to claim 5, wherein at least one fixed support structure for at least one fixed electrode is joined to a diaphragm of the diaphragm structure, the hollow space extends between the two diaphragms of the diaphragm structure to underneath the fixed support structure, and the support plate, together with the deflectable electrode, extends within the hollow space parallel to the fixed support structure.

7. The sensor element according to claim 1, wherein at least one deflectable electrode is assigned to each of the two diaphragms of the deflectable diaphragm structure, and a fixed counter-electrode is assigned to each deflectable electrode.

8. The sensor element according to claim 7, wherein the deflectable diaphragm structure and a configuration of deflectable and fixed electrodes are symmetrical with respect to the fixed support structure.

9. The sensor element according to claim 8, wherein the deflectable diaphragm structure, the fixed support structure, and the configuration of deflectable and fixed electrodes are symmetrical with respect to a support plate provided for the deflectable electrodes.

10. The sensor element according to claim 1, wherein electrode surfaces have an electrical insulation layer.

* * * * *